United States Patent
Hennecken et al.

(10) Patent No.: US 7,478,315 B1
(45) Date of Patent: Jan. 13, 2009

(54) PARALLEL SPECTRAL EQUALIZATION CHANNELS WITH LOW DENSITY PARITY CHECK CODES

(75) Inventors: Mark Hennecken, Parker, CO (US);
David J. Pereira, Thornton, CO (US)

(73) Assignee: Storage Technology Corporation, Louisville, CO (US)

( * ) Notice: Subject to any disclaimer, the term of this patent is extended or adjusted under 35 U.S.C. 154(b) by 1125 days.

(21) Appl. No.: 10/674,215

(22) Filed: Sep. 29, 2003

(51) Int. Cl.
*H03M 13/03* (2006.01)

(52) U.S. Cl. .................. 714/795; 714/786; 714/755; 375/262; 375/341; 369/59.22; 702/9

(58) Field of Classification Search ......... 714/794–795, 714/780, 786, 755; 375/341, 262; 360/46, 360/65
See application file for complete search history.

(56) References Cited

U.S. PATENT DOCUMENTS

| | | | |
|---|---|---|---|
| 5,237,527 A | 8/1993 | Oda | |
| 5,657,353 A | 8/1997 | Hatcher et al. | |
| 6,522,705 B1 | 2/2003 | Conway et al. | |
| 6,826,140 B2 * | 11/2004 | Brommer et al. | 369/94 |
| 2003/0026028 A1 * | 2/2003 | Ichihara et al. | 360/65 |

OTHER PUBLICATIONS

Schiff, Maurice, SystemView® by Elanix, Baseband Pulse Shaping for Improved Spectral Efficiency, AN 129, Mar. 2, 2000, pp. 1-6.
A brief historic of turbo codes, www.sc.enst-bretagne.fr/historic. html , p. 1.
Turbo Code Bibliography, Turbo Code and Related Work Reference List, www.ee.virginia.edu/CSL/turbo_codes/tcodes-bib/tcodes-bib. html, pp. 1-9.
Turbo Code and Related Patents, www.ee.virginia.edu/CSL/turbo_codes/patents.html, pp. 1-2.
LDPC Codes for Data Storage Channels, Electrical & Computer Engineer, Oct. 2, 2002, pp. 1-14.

* cited by examiner

*Primary Examiner*—Guy J. Lamarre
(74) *Attorney, Agent, or Firm*—Brooks Kushman P.C.

(57) ABSTRACT

The present invention combines low density parity checking with parallel equalization channels to enhance data retrieval from tape. Viterbi analysis is done as a precursor to the use of at least one low density parity decoder. A signal decoder may include a plurality of viterbi processors and at least one low density parity check decoder. The decoder may receive a plurality of pulse-shaped signals and produces decoded output signals.

18 Claims, 2 Drawing Sheets

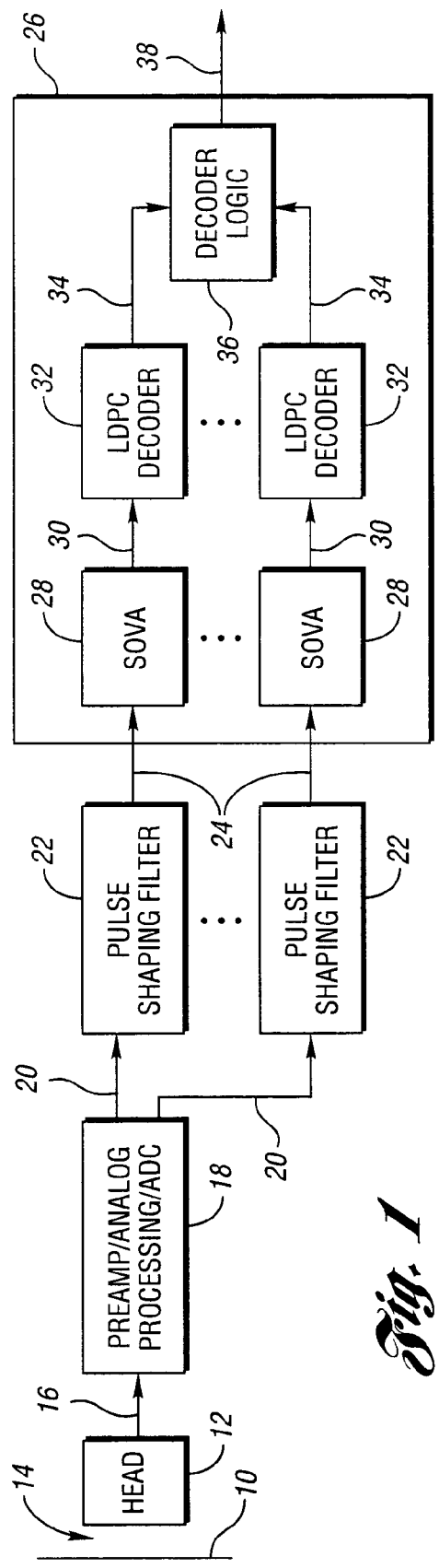
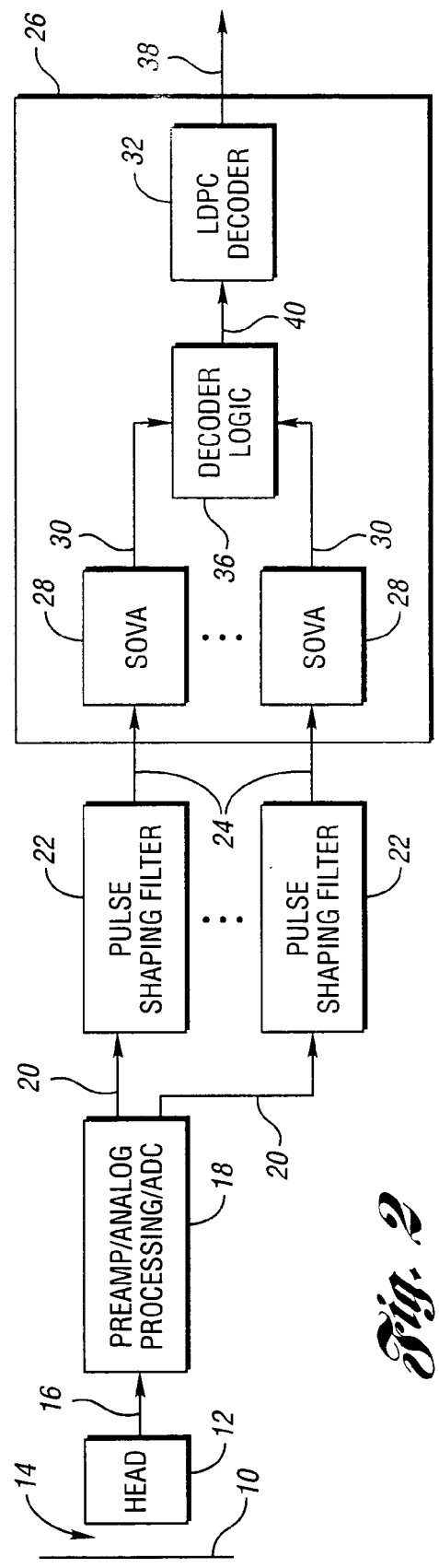

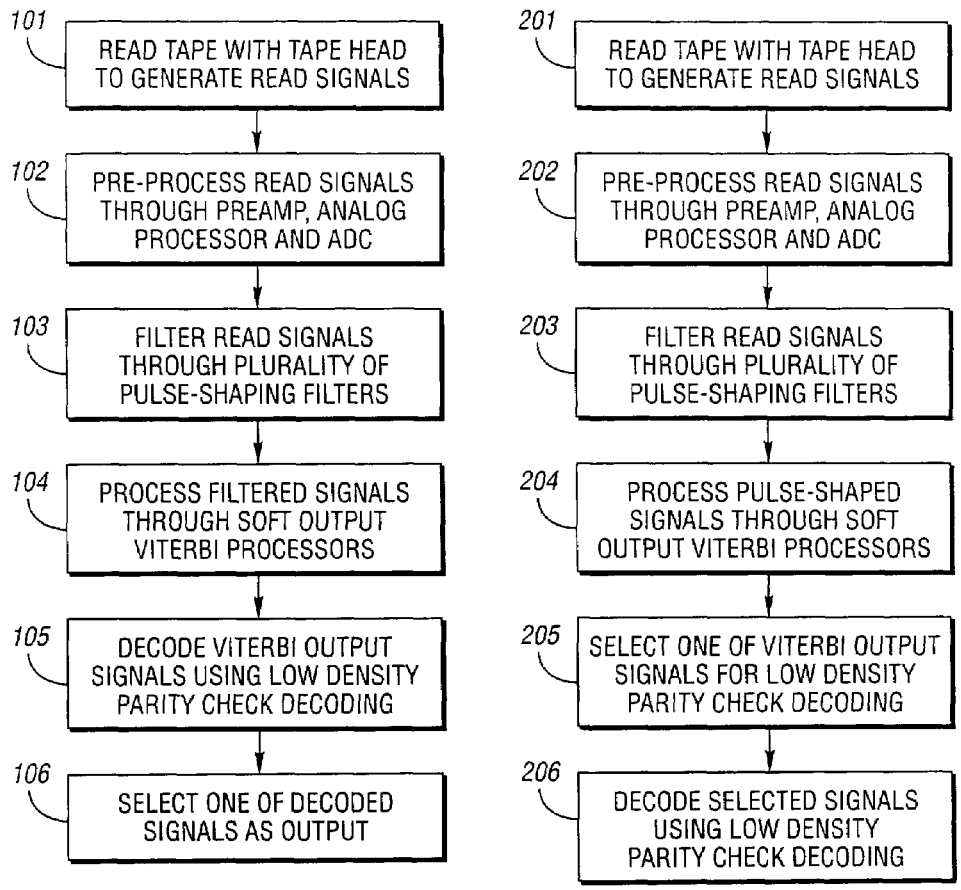
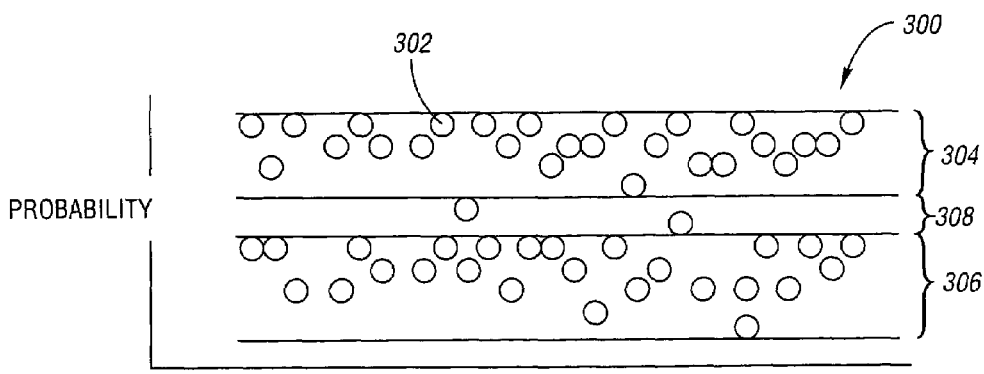

PARALLEL SPECTRAL EQUALIZATION CHANNELS WITH LOW DENSITY PARITY CHECK CODES

BACKGROUND OF THE INVENTION

1. Field of the Invention

The present invention relates to signal processing for enhancing the retrieval of data from magnetic tape.

2. Background Art

Data is stored on a magnetic tape as variations in the magnetic field produced by particles in the tape. This data is typically read by sensing these fields with a tape head. As the tape travels past the tape head, variations in the magnetic field induce a time-varying voltage in the head. The analog signals generated represent the data stored on the tape. The typical tape reader also incorporates pre-amplifiers, analog processors, analog-to-digital converters, and the like to process tape head output signals.

Increases in tape data storage capacity necessitate an increase in signal data density. However, increases in signal data density may decrease performance due to reduced signal-to-noise ratios. In addition, partial response channel systems depend heavily on inter-symbol interference to function properly. Such systems achieve this interference by passing the received signal through a pulse shaping filter matching the signal spectral response to channel requirements. However, variations in the head-to-tape positioning alter the signal spectral components. The resulting mis-equalization causes increasing signal degradation.

Low density parity check decoding is an evolving technology for retrieving data from magnetic storage media through partial response channels. Low density parity check decoding uses an iterative approach based on multiple passes of a signal containing data through a decoder. The information learned in each decoder pass is used in subsequent decoder passes. Iterations continue until the data is fully decoded from the signal or the design maximum number of decoder passes is reached. Low density parity check decoding can theoretically achieve an effective increase in signal strength of 5 dB, thus compensating for reduced signal amplitudes associated with higher signal data density recording.

SUMMARY OF THE INVENTION

It is an object of this invention to achieve reduced degradation due to lower signal-to-noise ratios and less sensitivity to variations in the head-to-tape separation due to increases in signal data density.

The present invention uses parallel spectral equalization channels together with a decoder based on low density parity checking to compensate for performance degradation due to increases in signal data density. The decoder incorporates viterbi analysis as a precursor to the use of at least one low density parity decoder. This provides a computationally efficient system and method of incorporating low density parity check decoding with parallel equalization channels to compensate for increased performance degradation due to increases in signal data density with variations in head-to-tape separation.

In accordance with the present invention, a system for use in a tape drive is provided. A tape head is provided to access magnetic tape. The tape head generates read signals based in part on a spatial relationship between the tape head and the tape. Each of a plurality of pulse shaping filters receives the read signals and produces pulse-shaped signals. Each pulse shaping filter has at least one filter parameter based on a possible tape head-to-tape spatial relationship unique to that filter. A signal decoder receives the pulse-shaped signals and produces decoded output signals. The signal decoder includes a plurality of viterbi processors, each accepting pulse-shaped signals from one of the plurality of pulse shaping filters. The signal decoder also includes at least one low density parity check decoder producing the decoded output signals based on output from one of the viterbi processors.

In an embodiment of the present invention, each viterbi processor includes a soft output viterbi processor.

In another embodiment of the present invention, the signal decoder includes one low density parity check decoder. Decoder logic selects one of the viterbi processor outputs as the low density parity check decoder input.

In still another embodiment of the present invention, the signal decoder includes a plurality of low density parity check decoders. Decoder logic selects output from one of the plurality of low density parity check decoders as the decoded output signals.

In yet another embodiment of the present invention, each viterbi processor generates a series of probabilities. Control logic may select output from one of the viterbi processors based on one or more of a distribution of the probabilities, a standard deviation of the probabilities, at least one number of indeterminate values, at least one viterbi metric, and the like.

A method of retrieving data from tape is also provided. The tape is read with a tape head to generate a read signal. The tape head has a spatial relationship with the tape as the tape passes the tape head described by at least one variable spatial parameter. The read signal is filtered with a set of parallel filters. Each filter receives the read signal and produces a filtered signal. Each filter is based on at least one unique value for the spatial parameters. Each filtered signal is processed with a viterbi algorithm. A decoded output signal is based on selecting and parity checking one of the viterbi processed filtered signals.

The above features, and other features and advantages of the present invention, are readily apparent from the following detailed descriptions thereof when taken in connection with the accompanying drawings.

BRIEF DESCRIPTION OF THE DRAWINGS

FIG. 1 is a block diagram of a system using multiple low density parity check decoders according to an embodiment of the present invention;

FIG. 2 is a block diagram of a system using a single low density parity check decoder according to an embodiment of the present invention;

FIG. 3 is a flow diagram of a method using multiple low density parity check decoders according to an embodiment of the present invention;

FIG. 4 is a flow diagram of a method using a single low density parity check decoder according to an embodiment of the present invention; and FIG. 5 is a graphic representation of the output stream of a viterbi processor.

DETAILED DESCRIPTION OF THE PREFERRED EMBODIMENT(S)

FIG. 1 depicts an embodiment of the system using multiple low density parity check decoders. In this embodiment, tape 10 is located relative to head 12 by a tape spacing distance 14 within a range of possible tape spacing distances. Head 12 is operative to generate read signals 16 based on the tape spacing distance 14. A pre-processor 18 uses amplifiers, analog processors, analog-to-digital converters, and other well known circuitry to pre-process the read signals 16. A plurality of pulse shaping filters 22 receive the pre-processed read signals 20 and produce a plurality of pulse-shaped signals 24. Each pulse shaping filter 22 has at least one filter parameter based on a particular tape-to-head spacing parameter. Preferably, each filter 22 compensates for a different tape-to-head spacing relationship. The tape-to-head spacing is typically a function of the distance between the tape 10 and head 12 in a direction normal to the surface of the tape 10. However, the tape-to-head spacing can reflect other spatial differences such as, for example, displacement of tape 10 across the width of head 12, rotation of tape 10 relative to head 12, and the like.

A signal decoder 26 receives the plurality of pulse-shaped signals 24 and produces decoded output signals 38. Signal decoder 26 includes a plurality of soft output viterbi processors 28, a plurality of low density parity check decoders 32, and decoder logic 36. Each soft output viterbi processor 28 accepts pulse-shaped signals 24 from one pulse shaping filter 22 and produces a series of probabilities as viterbi output signals 30. Each probability represents the chance that data is a one or a zero. A general discussion of viterbi processors is presented below. Each low density parity check decoder 32 receives viterbi output signals 30 from one soft output viterbi processor 28 and decodes the signals. The decoder logic 36 receives the low density parity check decoder output signals 34 and selects one of the low density parity check decoder output signals 34 as the signal decoder output signals 38. The decoder logic 36 can be implemented to use a variety of selection criteria such as selecting the signals with the tightest distribution of probabilities based on minimum and maximum values, selecting the signals with the minimum standard deviation, selecting the signals with the least number of indeterminate values, using viterbi metrics, and the like.

FIG. 2 depicts an embodiment of the system using a single low density parity check decoder 32. In this embodiment, the signal decoder 26 comprises a plurality of soft output viterbi processors 28, decoder logic 36, and a single low density parity check decoder 32. As above, each soft output viterbi processor 28 accepts pulse-shaped signals 24 from one pulse shaping filter 22 and produces a series of probabilities as viterbi output signals 30. The decoder logic 36 receives the viterbi output signals 30 and selects one of the viterbi output signals 30 as the input signals 40 for the single low density parity check decoder 32. The decoder logic 36 can be implemented to use selection criteria such as selecting the signals with the tightest distribution of probabilities based on minimum and maximum values; selecting the signals with the minimum standard deviation; selecting the signals with the least number of indeterminate values; using viterbi metrics; and the like. The signal decoder output signals 38 are the output signals from the single low density parity check decoder 32.

FIG. 3 is a flow diagram of an embodiment of the present invention using multiple low density parity check decoders. A tape head 12 reads a tape 10 generating read signals 16, as in block 101. Tape 10 is separated from head 12 by a tape spacing distance 14. A pre-processor 18 pre-processes the read signals 16 using pre-amplifiers, analog processors, and analog-to-digital converters, as in block 102, to produce a digital output stream. A plurality of pulse shaping filters 22 filter the pre-processed read signals 20 producing a plurality of pulse-shaped signals 24, as in block 103. Each pulse shaping filter has at least one filter parameter based on a particular tape spacing relationship. A plurality of soft output viterbi processors 28 in signal decoder 26 process the pulse-shaped signals 24, as in block 104. Each soft output viterbi processor 28 produces a series of probabilities as viterbi output signals 30. A plurality of low density parity check decoders 32 decodes the viterbi output signals 30, as in block 105. The decoder logic 36 selects one of the low density parity check decoder output signals 34 as the signal decoder output signals 38, as in block 106.

FIG. 4 is a block flow diagram of an embodiment of the present invention using a single low density parity check decoder. A tape head 12 reads a tape 10 generating read signals 16, as in block 201. Tape 10 is separated from head 12 by a tape spacing distance 14. A pre-processor 18 pre-processes the read signals 16, as in block 202. A plurality of pulse shaping filters 22 filter the pre-processed read signals 20 producing a plurality of pulse-shaped signals 24, as in block 203. Each pulse shaping filter has at least one filter parameter based on a particular tape spacing relationship. A plurality of soft output viterbi processors 28 in the signal decoder 26 process the pulse-shaped signals 24, as in block 204. Each soft output viterbi processor 28 produces a series of probabilities as viterbi output signals 30. The decoder logic 36 selects one of the viterbi processed signals 30 as the input signals 40 for the single low density parity check decoder 32, as in block 205. The low density parity check decoder decodes the selected signals, as in block 206. The signal decoder output signals 38 are the output signals from the single low density parity check decoder 32.

FIG. 5 is a graphic representation of an output stream of a soft output viterbi processor. A soft output viterbi processor samples the incoming signals and assigns each sample a probability value as to whether it is likely to be a "zero" or a "one." Processor output, shown generally by 300, comprises a stream of probabilities, one of which is indicated by 302. Probabilities falling within range 304 are classified as a "one." Probabilities falling within range 306 are classified as a "zero." Probabilities falling outside of ranges 304, 306 are classified as indeterminate, as indicated by range 308. Final conversion of the output stream into a bit stream requires the use of a downstream decoder. As discussed above, the downstream decoder in the present invention is preferably a low density parity check decoder.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention. More specifically, those skilled in the art will recognize that the filters, processors, and logic described above could be implemented using hardware, software, or a combination of hardware and software.

What is claimed is:

1. A system for use in a tape drive, the system comprising:
   a tape head accessing a tape, the tape head generating read signals based on a spatial relationship between the tape head and the tape;
   a plurality of pulse shaping filters, each pulse shaping filter receiving the read signals and producing pulse-shaped signals, each pulse shaping filter having at least one filter parameter based on a possible tape head-to-tape spatial relationship, the at least one filter parameter unique to that filter; and
   a signal decoder receiving the plurality of pulse-shaped signals and producing decoded output signals, the signal decoder comprising
   (a) a plurality of viterbi processors, each viterbi processor accepting pulse-shaped signals from one of the plurality of pulse shaping filters, and (b) at least one low density parity check decoder producing the decoded output signals based on the output from one of the plurality of viterbi processors.

2. The system of claim 1 wherein each viterbi processor comprises a soft output viterbi processor.

3. The system of claim 1 wherein the at least one low density parity check decoder is one low density parity check decoder having a low density parity check decoder input, the signal decoder further comprising decoder logic operative to select one of the plurality of viterbi processor outputs as the low density parity check decoder input.

4. The system of claim 1 wherein the at least one low density parity check decoder is a plurality of low density parity check decoders, each low density parity check decoder having a low density parity check decoder input in communication with one of the plurality of viterbi processor outputs, the signal decoder further comprising decoder logic operative to select output from one of the plurality of low density parity check decoders as the decoded output signals.

5. The system of claim 1 wherein each viterbi processor generates a series of probabilities.

6. The system of claim 5 further comprising control logic selecting output from one of the plurality of viterbi processors.

7. The system of claim 6 wherein the control logic bases output selection on a distribution of the probabilities.

8. The system of claim 6 wherein the control logic bases output selection on a standard deviation of the probabilities.

9. The system of claim 6 wherein each series of probabilities contains at least one intermediate value and wherein the control logic bases output selection on at least one number of indeterminate values.

10. The system of claim 6 wherein the control logic bases output selection on at least one viterbi metric.

11. A method of retrieving data from tape comprising;
reading the tape with a tape head to generate a read signal, the tape head having a spatial relationship with the tape as the tape passes the tape head, the spatial relationship described by at least one variable spatial parameter;
filtering the read signal with a set of parallel filters, each filter receiving the read signal and producing a filtered signal, each filter based on at least one unique value for the at least one variable spatial parameter;
processing each filtered signal with a viterbi algorithm; and
generating a decoded output signal based on selecting and parity checking one of the viterbi processed filtered signals.

12. The method of claim 11 wherein generating a decoded output signal comprises:
selecting one of the viterbi processed filtered signals; and
parity checking the selected viterbi processed filtered signals.

13. The method of claim 11 wherein generating a decoded output signal comprises:
low density parity checking each of the viterbi processed filtered signals; and
selecting one of the low density parity checked viterbi processed filtered signals.

14. The method of claim 11 wherein processing each filtered signal with a viterbi algorithm generates a series of probabilities.

15. The method of claim 14 wherein generating a decoded output is based on a distribution of the series of probabilities.

16. The method of claim 14 wherein generating a decoded output is based on standard deviation of the series of probabilities.

17. The method of claim 14 wherein generating a decoded output is based on at least one number of indeterminate values in the series of probabilities.

18. The method of claim 14 wherein generating a decoded output is based on viterbi metrics.

* * * * *